United States Patent

Nakamura et al.

[11] Patent Number: 5,955,748
[45] Date of Patent: Sep. 21, 1999

[54] END FACE LIGHT EMITTING TYPE LIGHT EMITTING DIODE

[75] Inventors: Yukio Nakamura; Mitsuhiko Ogihara; Masumi Taninaka; Takao Kusano; Masumi Koizumi; Hiroyuki Fujiwara; Makoto Ishimaru; Masaharu Nobori; Tsutomu Nomoto, all of Tokyo, Japan

[73] Assignee: Oki Electric Industry Co., Ltd., Tokyo, Japan

[21] Appl. No.: 08/942,302

[22] Filed: Oct. 1, 1997

Related U.S. Application Data

[63] Continuation of application No. 08/501,649, Jul. 12, 1995, abandoned.

[30] Foreign Application Priority Data

Jul. 19, 1994 [JP] Japan .................................. 6-166504

[51] Int. Cl.⁶ .................................................. H01L 33/00
[52] U.S. Cl. ............................ 257/88; 257/96; 257/97
[58] Field of Search .............................. 257/88, 96, 95, 257/99, 98, 89–94, 97

[56] References Cited

U.S. PATENT DOCUMENTS

| | | | |
|---|---|---|---|
| 4,766,470 | 8/1988 | Scholl et al. | 357/17 |
| 4,862,230 | 8/1989 | Uji | 257/96 |
| 5,072,263 | 12/1991 | Watanabe et al. | 257/99 |
| 5,162,878 | 11/1992 | Sasagawa et al. | 257/88 |
| 5,192,985 | 3/1993 | Abe | 257/95 |
| 5,298,768 | 3/1994 | Okazaki et al. | 257/88 |
| 5,309,004 | 5/1994 | Watanabe et al. | 257/91 |
| 5,355,385 | 10/1994 | Amano et al. | 372/49 |
| 5,404,031 | 4/1995 | Sasaki et al. | 257/95 |
| 5,498,883 | 3/1996 | Lebby et al. | 257/95 |

FOREIGN PATENT DOCUMENTS

| | | |
|---|---|---|
| 1-117073 | 5/1989 | Japan . |
| 2-125765 | 5/1990 | Japan . |
| 3-201574 | 9/1991 | Japan . |
| 4-329678 | 11/1992 | Japan . |
| 5-354384 | 12/1992 | Japan . |
| 5-31955 | 2/1993 | Japan . |
| 5-69592 | 3/1993 | Japan . |
| 5-82836 | 4/1993 | Japan . |
| 5-218497 | 8/1993 | Japan . |

Primary Examiner—Sara Crane
Attorney, Agent, or Firm—Jones Volentine, LLP

[57] ABSTRACT

An end facet light emitting type LED has a slanted light emitting side wall relative to a substrate surface. A method for manufacturing end facet light emitting type light emitting devices prevents the pn-junction regions of the devices from being damaged while a semiconductor wafer is diced to separate light emitting devices from one another. A recess is formed on the semiconductor wafer having a depth which is deeper than the pn-junction. A portion to be cut during dicing of the wafer is vertically and horizontally separated from the pn-junction regions, so that if cracks occur when the wafer is diced, the cracks do not affect the light emitting characteristics of the devices.

10 Claims, 15 Drawing Sheets

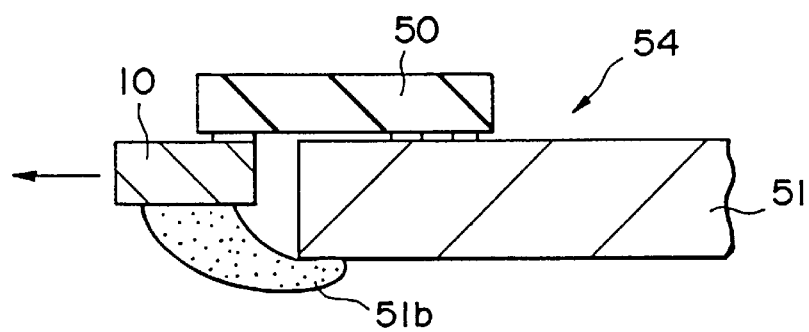
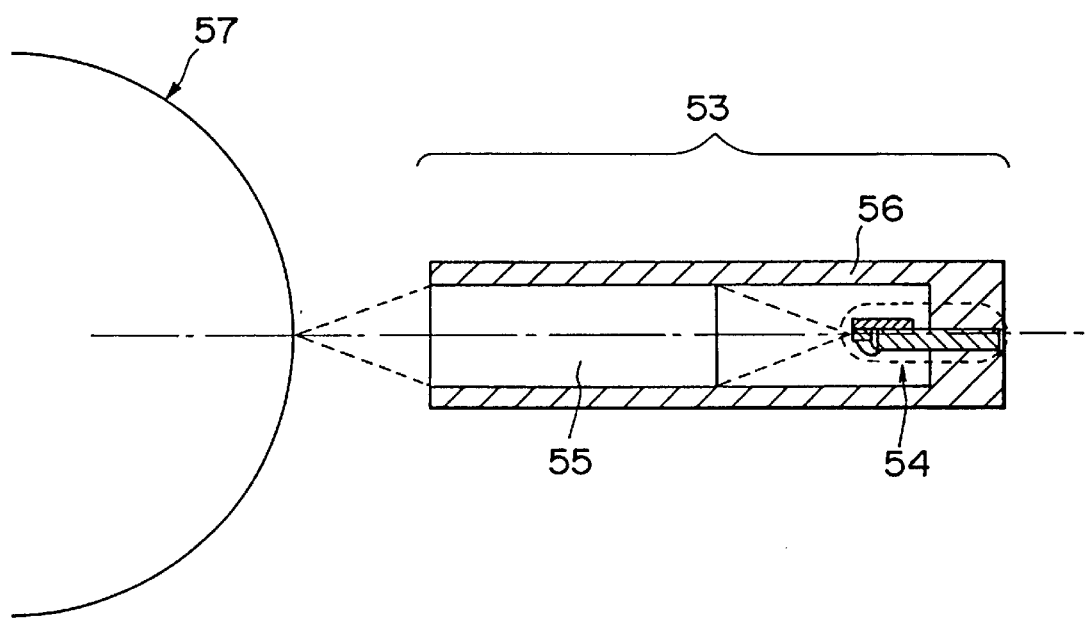

END FACE LIGHT EMITTING TYPE LIGHT EMITTING DIODE

This application is a continuation of application Ser. No. 08/501,649, filed Jul. 12, 1995, now abandoned.

REFERENCE TO RELATED APPLICATION

This application claims the priority right under 35 U.S.C. 119 of Japanese Patent Application No. Hei 06-166504 filed on Jul. 19, 1994, the entire disclosure of which is incorporated herein by reference.

BACKGROUND OF THE INVENTION

1. Field of the Invention

This invention relates to an end facet light emitting type light emitting diode (LED) array suitably used in a light source of an electrophotographic printer, a manufacturing method for an end facet light emitting type light emitting device, including an LED frabricated array by use of a dicing technique, and to a measuring method for measuring light emitting characteristics of such a light emitting device.

2. Description of Related Art

Light emitting diode arrays (LED arrays) are used, for example, as a light source for electrophotographic printers. One particular type of such LED arrays is referred as an end facet light emitting type LED array. Each end facet light emitting type LED array has a plurality of light emitting diodes. A known light emitting diode is formed with its light emitting end facet being be perpendicular to the surface of a substrate. Structures and manufacturing methods for the end facet light emitting type LED array are disclosed, for example, in Japanese laid-open Patent Publication No. 2-125,765 (Reference 1) or No. 5-31955 (Reference 2), respectively. For example, Reference 1 discloses that each of the end facet light emitting type LED arrays can be obtained by dicing a semiconductor wafer having stacked layers of an n-type electrode, an n-type GaAs buffer layer, an n-type AlGaAs layer, a p-type AlGaAs layer and a p-type electrode. Also, Reference 2 discloses that a light emitting end facet can be fabricated on a semiconductor wafer having a double hetero structure by employing a dry etching method utilizing a chloride gas. Various types of similar structures having light emitting end facets perpendicular to the surface of a substrate are also disclosed. For example, Japanese laid-open Patent Publication No. 1-117,073 discloses an LED having an inclined rear end facet, in which the inclined rear end effectively reflects unnecessary light to avoid unwanted oscillation. Japanese laid-open Patent Publication No. 3-201,574 also discloses another conventional LED having a severred end facet at the current block layer for preventing light from coming back to an active layer from which the light is emitted.

However, in the case of the conventional LED array in which the light emitting end facet is perpendicular to the surface of the substrate, the size of an area from which the emitting light is taken out or derived (hereinafter called a light deriving area) is limited, at the maximum, by the product of a thickness and a width of the light emitting layer. More concretely, since the p-type AlGaAs layer of the LED array disclosed in Reference 1 or the active layer region, among the n-type clad layer, the active layer and the p-type layer which constitutes the double hetero structure, of the LED array disclosed in Reference 2 corresponds to the light emitting layer, the light deriving area size of such LED arrays is limited by the thickness and the width of the light emitting layer.

To separate each LED array from the others, semiconductor wafers on which LED arrays have been formed have to be precisely cut. One of known methods to cut the wafer is to dice it at the border of each array. To increase the number per wafer of LED arrays to be produced, each array has to be formed without unnecessary space on the wafer. An updated design of such an LED array places the border of each array very close to its light emitting region. When diced, however, such a wafer tends to be cracked, and when the light emitting region of the LED is cracked, the LED cannot properly produce light from the cracked region. Moreover, with a conventional dicing technique, interconnection layers on the top of the LED array are also subject to cutting when the wafer is diced. Burrs that incidentally formed at an interconnection layer when the wafer had been diced may contact with a semiconductor layer having the opposite conductivity to the interconnection layer, thereby short-circuiting between the interconnection layer and the semiconductor layer.

With another conventional method, an end facet of the LED is formed by dry etching method. However, since deep grooves have to be formed at the respective borders of LED arrays to separate one LED array from the others, portions to be eliminated by the dry etching can be widen as time elapses, thereby requiring its array design to be added with extra margins on the limited space on the wafer and thereby reducing the number per wafer of the LED arrays. Japanese laid-open Patent Publication No. 5-69,592 discloses an LED array having a plurality of LEDs, each of which has an inclined light reflecting end facet. In manufacturing this LED array, however, the semiconductor substrate of the LED array is etched by ion milling, so that this method is unsuitable for a design in which each array is formed within a very small area. Furthermore, such ion milling over the tilted substrate may cause damages on an active layer of the LED.

With conventional methods, light emitting characteristics of the LED array could not be measured before each array is cut separately. Accordingly, the light emitting characteristics of the LED array must be measured piece by piece, so that setting the respective arrays to a measurement apparatus inevitably increases overall work load.

SUMMARY OF THE INVENTION

It is an object of the invention to provide an end facet light emitting type light emitting diode with a slant end facet relative to the surface of the substrate in which the light deriving area can be broaden so that the light deriving efficiency becomes higher than that of the conventional LED.

It is another object of the invention to provide a manufacturing method for a light emitting diode array with a light emitting end facet in which the light emitting end facet is formed without cracks or damages even where a substrate on which light emitting diodes are collectively formed is diced.

It is still another object of the invention to provide a measuring method for a light emitting diode array enabling each diode to be measured during the manufacturing process thereof before each array is separated from the others.

One of the foregoing objects of the invention is accomplished with an end facet light emitting type light emitting diode having an inclined (or slant) light emitting end facet. It is preferable to employ a protection layer on the slant end facet for protecting the light emitting end facet. The slant facet defined in the invention includes not only a slant facet which is slanted toward a light emitting direction, that is, a regularly tapered state slant facet but also a reversely tapered-state slant facet which is slanted toward the surface of the substrate.

Another foregoing object is accomplished with a manufacturing method for a light emitting diode array having a plurality of light emitting diodes, each having a pn-junction or possibly a pin junction, wherein at least two LED arrays are formed on a semiconductor wafer to be diced and each light emitting diode array is separated from others, including the step of forming, at a portion where the semiconductor wafer is to be diced at least on a side of the light emitting end facet of each light emitting diode array, a recess having a slant side wall and a depth exceeding the depth of the pn-junction, by etching, and the step of dicing the semiconductor wafer on which the recess has already formed, at a portion of the recess away from the pn-junction. In a modified embodiment, the pn-junction can be formed even after the recess is formed on the semiconductor wafer. The depth of the recess is preferably set at a proper depth in consideration that if the depth is so shallow, the pn-junction face and the portion to be diced would not be separated vertically enough from each other and that if the depth is so deep, the etching process becomes hard.

It is preferred, when the light emitting end facet is formed with a protection film, to selectively form a thin film capable of forming a light emitting end facet protection film, at least at the side wall of the recess, using an etching mask at a time of the etching when the recess is formed, between the steps for forming the recess and for dicing the wafer. This is because the end facet protection film can be formed without providing any particular mask for such a protection film.

The slant side wall can be a slant side face making the recess wider as approaching the top side of the recess (slant face-up) or making the recess narrower as approaching the top side of the recess (slant face-down). When the light emitting characteristics is measured by the following method, the inclined side wall of the slant face-up is preferable.

In another aspect of the invention, a measuring method for light emitting characteristics of an end facet light emitting type light emitting diode array having a plurality of light emitting diodes, includes the step of applying an electrical signal to the light emitting diode after the light emitting diodes and a recess having a slant facet are formed and before a semiconductor wafer on which light emitting diode arrays are formed is diced, and the step of measuring light emitting characteristics of the respective light emitting diodes by detecting light reflected upward at the slant facet from the semiconductor wafer, selected among lights generated at the respective light emitting diodes according to the application of the electrical signal. According to this method, light emitting characteristics of light emitting diodes are measurable with the undivided semiconductor wafer on which multiple diodes are formed.

BRIEF DESCRIPTION OF THE DRAWINGS

The above and other objects and features of the invention are apparent to those skilled in the art from the following preferred embodiments thereof when considered in conjunction with the accompanied drawings, in which:

FIG. 11 is a cross sectional view taken along IX—IX line in FIG. 10;

FIG. 12 is a cross sectional view of the light emitting diode array shown in FIG. 3 incorporated in an electrophotographic printer;

DETAILED DESCRIPTION OF THE PREFERRED EMBODIMENTS

Embodiment of the first aspect of the invention

Figure 1A:
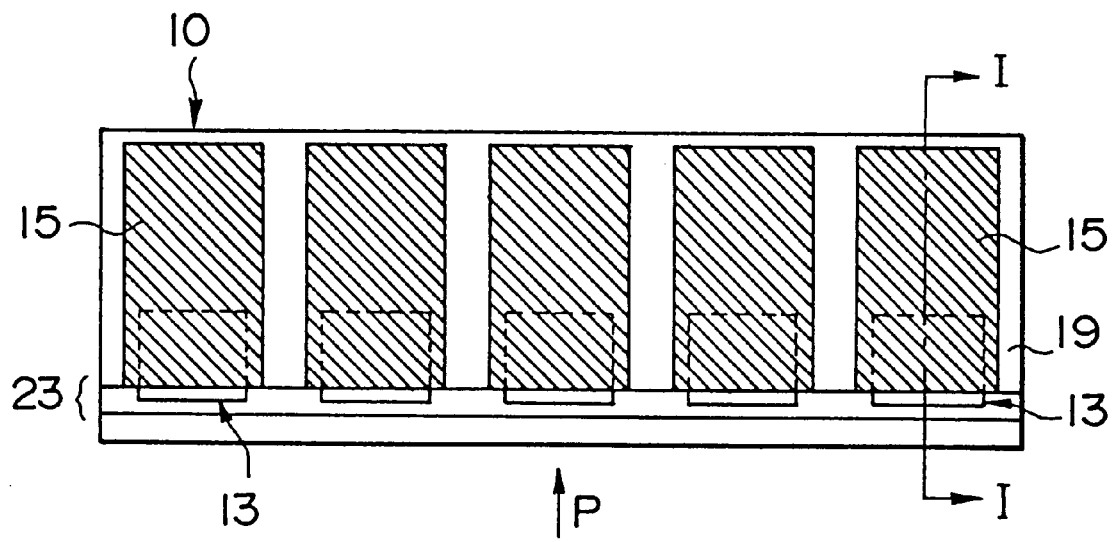
FIG. 1A shows a plan view of an end facet light emitting type LED array according to the preferred embodiment of the first aspect of the invention.
Figure 1B:
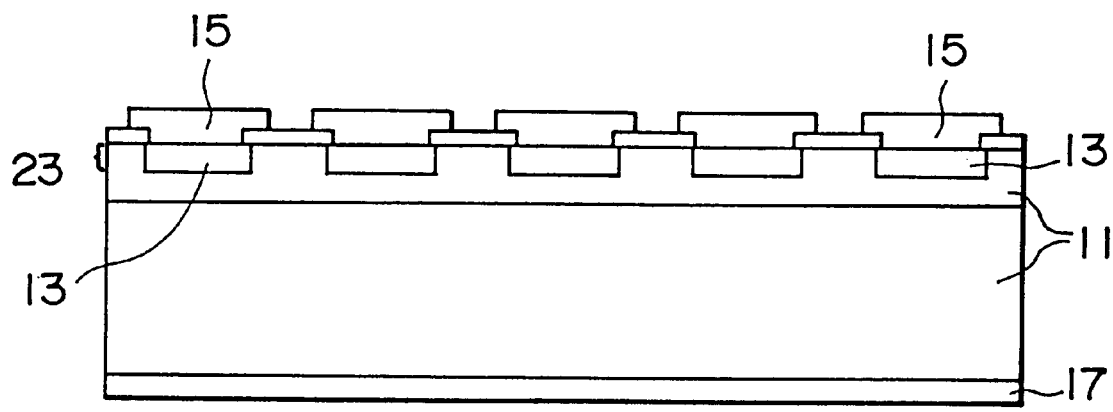
FIG. 1B shows a side view taken along P direction in FIG. 1A.
Figure 2:
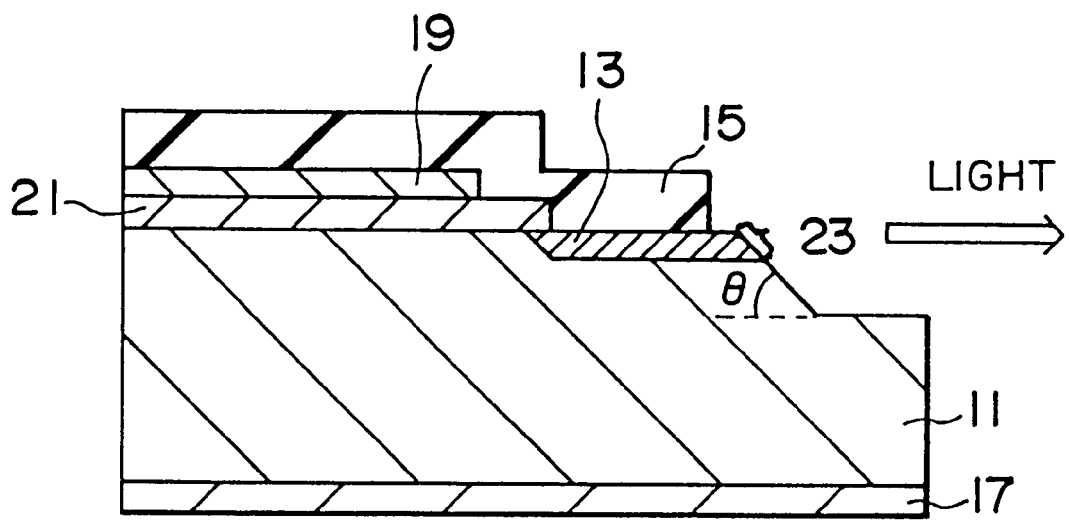
FIG. 2 shows a cross sectional view taken along I—I line in FIG. 1A.

Firstly, a description will be made in detail referring to FIGS. 1A and 1B and FIG. 2 an end facet light emitting type LED array according to the preferred embodiment of the first aspect of the invention.

In the drawings, a numeral 10 denotes an end facet light emitting type LED array having a plurality of light emitting diodes, and a numeral 11 denotes a semiconductor substrate having the first conductivity type. In the embodiment, the semiconductor substrate 11 with an n-type is utilized. More precisely, the n-type semiconductor substrate 11 is constituted of an n-type GaAs substrate and an n-type GaAsP layer epitaxially grown on the n-type GaAs substrate. A p-type GaAsP layer 13, which is formed by diffusion of p-type impurities into the n-type semiconductor substrate 11 with a predetermined interval corresponding an array pitch of the LED, is provided as a light emitting layer.

Numerals 15, 17 and 19 respectively denotes a p-side electrode, an n-side electrode, and an insulating film for electrically insulating the p-side electrode 15 from the n-type semiconductor substrate 11. A diffusion protection film 21 shown in FIG. 2 is provided to prevent diffusion of p-type impurities, which are used to form the p-type GaAsP layer 13, into regions except for the prescribed region of the n-type semiconductor substrate 11. The end facet light emitting type LED shown in FIG. 2 according to the invention is constructed such that a light emitting end facet 23 is placed on a slant with an angle θ relative to the surface of the substrate (the major surface of the semiconductor substrate 11 ). The instant embodiment, in particular, employs a slant facet inclining toward the light emitting direction (a regularly tapered-state slant facet). Although the angle θ of this example is set to be approximately 40 to 50 degrees, the angle θ is not necessarily limited to this range. If the light emitting end facet is formed to be perpendicular to the surface of the substrate, the light deriving area is given by the product of the width and the thickness of the p-type GaAsP layer. Accordingly, the light deriving area according to the present invention will be enlarged because of the light emitting end facet being on a slant so that the light from the light emitting layer (p-type GaAsP layer 13) is considered to be derived effectively.

First Embodiment of the second aspect of the invention

Referring to the drawings in detail, in particular, to FIGS. 3A to 3I and FIG. 4, a manufacturing method for a light emitting diode array according to the first preferred embodiment of the second aspect of the invention is shown.

Figure 3A:
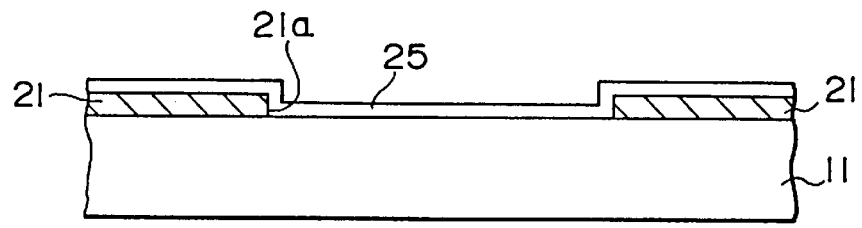
FIGS. 3A through 3I show cross sectional views of a process sequence for a manufacturing method for a light emitting diode array according to the first preferred embodiment of the second aspect of the invention.

First, an anti-diffusion film 21 is formed on an n-type semiconductor body 11 constituted of an n-type GaAs substrate and an n-type GaAsP layer epitaxtially grown on the n-type GaAs substrate, by known film forming methods, such as vaporization, sputtering or CVD (Chemical Vapor Deposition), and photolithography and etching. The semiconductor body 11 is in the form of a wafer, which is diced afterward. The anti-diffusion film 21 can be made of one of, such as, alumina film, nitride film, or silicon oxide film. The anti-diffusion film 21 can be formed with the thickness of around 50 to 100 nanometers. Windows 21a at which the surface of the semiconductor body 11 is exposed are opened in the anti-diffusion film 21. The windows 21a are placed where diffusion layers are to be formed subsequently. As shown in FIG. 3A, a diffusion control film 25 is formed on the semiconductor body 11 on which the anti-diffusion layer 21 is formed, by the known film forming methods. The diffusion control film 25 can be made of one of, such as, alumina film, nitride film, silicon oxide film, or PSG (Phosphor-Silicate Glass) film. The diffusion control film 25 can be formed with the thickness of about 10 to 20 nanometers.

Figure 3B:
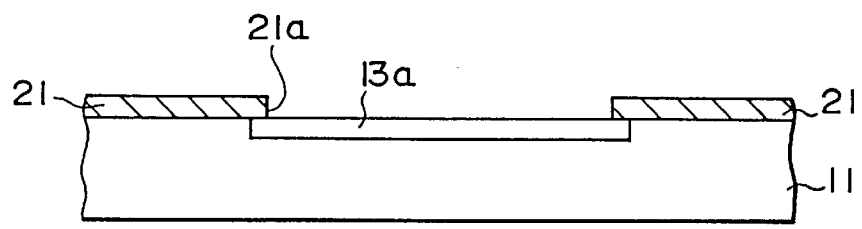

A p-type GaAsP layer 13a, as shown in FIG. 3B, is formed by vapor diffusion of p-type impurities such as zinc (Zn) into the semiconductor body substrate 11 through the diffusion control film 25 at which the anti-diffusion film 21 is opened. The single p-type GaAsP layer 13a will be used for two of LED arrays and will be divided later. The used diffusion control film 25 is then removed by proper means.

Figure 3C:
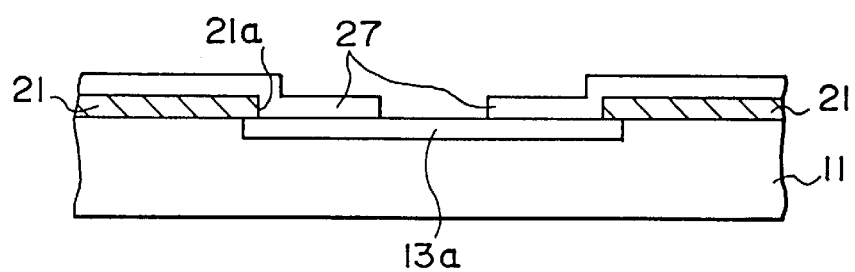
Figure 3D:
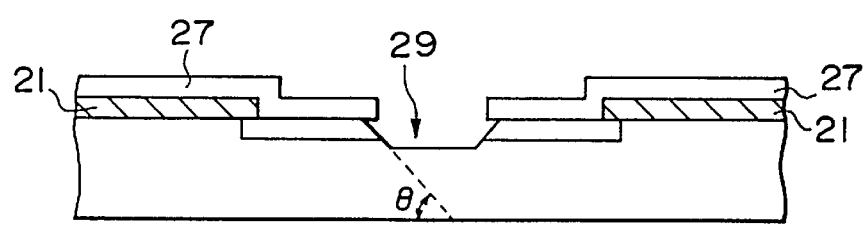

Predetermined recesses, one of essential features of this invention, are formed. In this embodiment, the predetermined recess is formed at the border between the LED arrays next to each other, or at a portion where the substrate is diced on the side of light emitting end facet of the LED arrays. As shown in FIG. 3C, a photoresist is coated on the semiconductor body 11 and the anti-diffusion film 21 and patterned so as to form a mask 27 for etching. Subsequently, the entire wafer on which the mask 27 is formed is subject to etching. The surface of the semiconductor body 11 is etched so as to form the recesses whose side walls are made slanted at portions that the mask 27 is opened. The slant side wall of the recess 29 later constitutes an end facet from which light is emitted. Where the multilayered body, constituted of the n-type GaAs substrate and the n-type GaAsP epitaxitial layer, whose major surface is the {100 } face, is used as the n-type semiconductor body 11, if the body 11 is dipped into an etchant related to sulfuric acid, phosphoric acid, or citric acid, recesses 29 whose side wall is angled of θ (see, FIG. 3D), about 50 degrees, to the major surface of the semiconductor body 11 are formed on the semiconductor body 11. As an etchant, for example, a liquid mixture of citric acid aqueous solution ($C_3H_4(OH)(COOH)_3 \cdot H_2O$) of 50 percents by weight and hydrogen peroxide in a predetermined ratio can be used as an etchant related to the citric acid. This liquid is suitable for an etchant since it has been turned out that the liquid inflicts little damages on aluminum electrodes and insulation films. In particular, it is suitable where the recesses are formed after the p-side electrode has been formed, as in a second embodiment as described infra. The semiconductor body is not limited to ones whose major surface is the {100 } face. A semiconductor body made from a wafer having any crystal direction can be used as long as it is fabricated so as to form recesses having slanted side walls. Though in this embodiment the angle θ between the side wall of the recess 29 and the body's major surface is about 50 degrees, this angle is merely an example. A preferred angle θ is determined in consideration with unfavorable situations that the LED array's size becomes larger where the angle θ is so small and that LED does not have the inclined end facet where the angle θ is so close to 90 degrees.

Figure 3E:
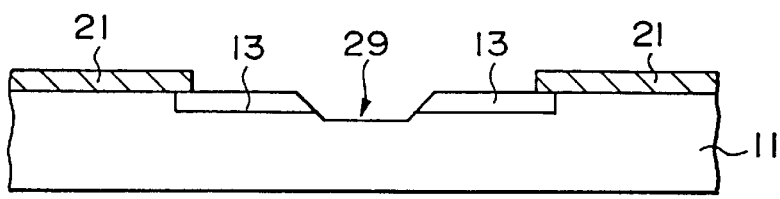

The recess 29 is formed so as to be deeper than the depth of pn-junction constituted of the p-type GaAsP layer 13a and the n-type semiconductor body 11. Setting thus the depth of the recess 29 makes the position of the p-type GaAsP layer 13a, as a light emitting layer, vertically different from a portion to be diced afterward, so that little impacts at the time of dicing would affect the light emitting layer. Such depth of the recess 29 further divides the p-type GaAsP layer 13a that had formed over areas for two LED arrays 10 next to each other. The mask 27 is then removed by proper means as shown in FIG. 3E. It is to be noted that although in this embodiment the recess 29 having the inclined side wall that the width of the recess 29 becomes broader as approaching to the top is exemplified, the recess 29, when considered with the device itself, may has a reversed slant side wall that the width becomes narrower. Such a reversed slant side wall could be formed by utilizing crystal directions of the semiconductor body to be etched.

Figure 3F:
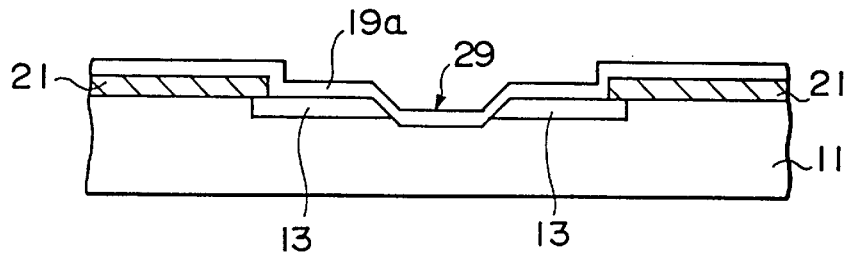
Figure 3G:
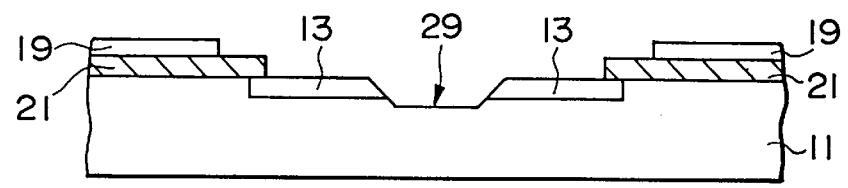

As shown in FIG. 3F, an insulation film 19a is formed on the entire surface of the wafer by known film forming methods in order to form insulation film insulating the n-type semiconductor body 11 from a p-side electrode. The insulation film 19a can be made of one of, such as, alumina film, nitride film, or silicon oxide film. The insulation film 19a can be formed with the thickness of around 50 to 100 nanometers. The insulation film 19a is then fabricated by known lithography and etching into a patterned insulation film 19 as shown in FIG. 3G.

Figure 3H:
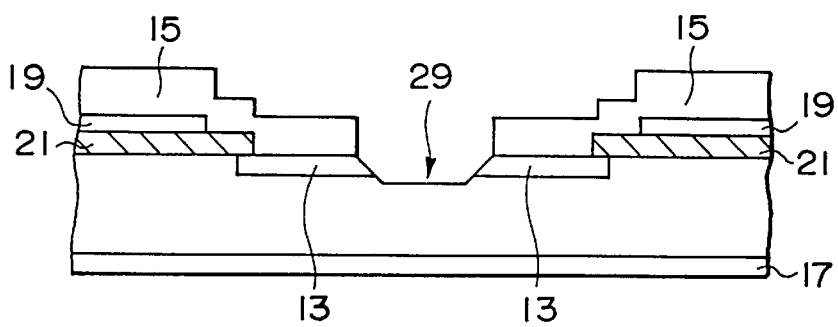

Subsequently, a p-side electrode 15 to be connected to the p-type GaAsP layer 13 is formed by known film forming methods and micro-fabrication technique, and an n-side electrode 17 is formed as shown in FIG. 3H on the back surface of the n-type semiconductor body 11. The n-side electrode 17 can be formed after the back surface of the n-type semiconductor body 11 is ground to improve the device characteristics. The p-side electrode 15 can be made from any material as long as it constitutes an ohmic contact for the p-type GaAsP layer 13. Aluminum can be used as a material for forming the p-side electrode 15. The p-side electrode 15 has a plan shape as shown by double dotted lines in FIG. 4 such that each piece of the electrode 15 almost covers the region over the p-type GaAsP layer 13. The n-side electrode 17 can be made from any material as long as it constitutes an ohmic contact for the n-type semiconductor body 11. Gold alloy can be used as a material for forming the n-side electrode 17. The wafer shown in FIG. 3H carries at this time multiple LED arrays on its surface.

Figure 3I:
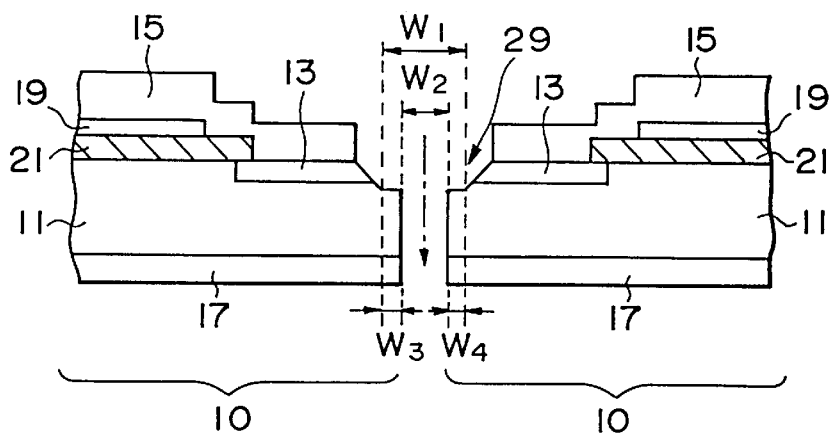
Figure 4:
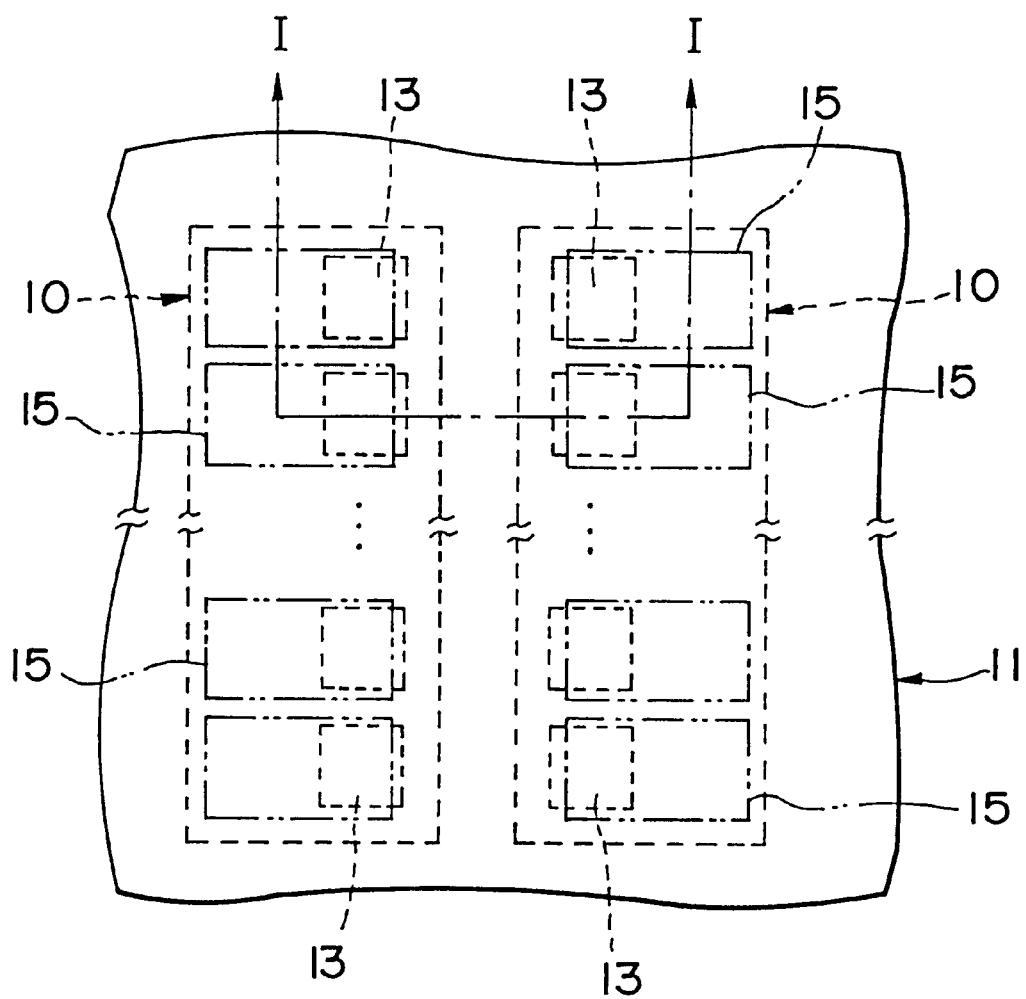
FIG. 4 shows a plan view of the light emitting diode array shown in FIG. 3 before the array is diced.

The wafer is then subject to dicing, as another feature of the invention. That is, the semiconductor wafer on which the multiple LED arrays 10 have been formed is cut at a position away from the pn-junction in the recess 29 from the bottom of the recess 29 to the back surface to the body 11. In this embodiment, the semiconductor wafer is cut, as shown in FIG. 3I, with cutting width $W_2$ that is narrower than the bottom width $W_1$ of the recess 29. It is preferable to design the size of the recess 29 and the cutting width $W_2$ so that margins W3, W4 on the LED arrays' light emitting end facet side of the n-type semiconductor body remain with about 50 to 60 micrometer sizes after dicing. When such margins are thus set, no crack may affect the light emitting layer even if occurring at the margins.

Second Embodiment

Although in the first embodiment the p-side electrode 15 is formed after the predetermined recess 29 is formed, the p-side electrode 15 can be formed prior to formation of the recess 29, as described below as the second embodiment. Now, referring to FIGS. 5A through 5G, there describes the process according to the second embodiment.

Figure 5A:
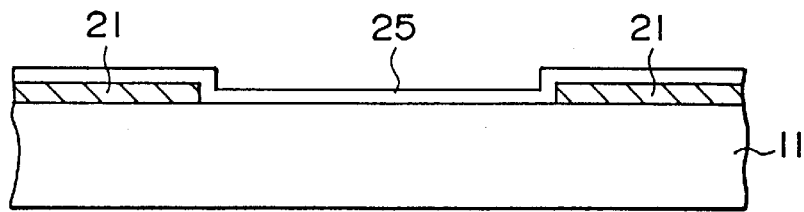
FIGS. 5A through 5G show cross sectional views of a process sequence for a manufacturing method for a light emitting diode array according to the second preferred embodiment of the second aspect of the invention.
Figure 5B:
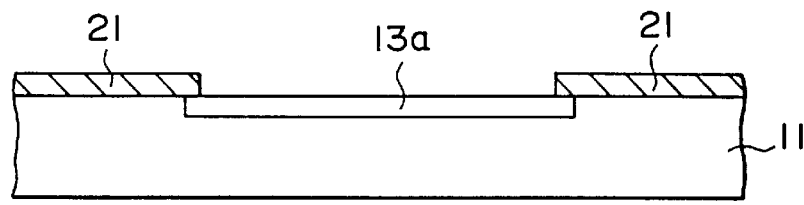

First, an anti-diffusion film 21 and an diffusion control film 25 are formed respectively on an n-type semiconductor body 11 in the same manner as the first embodiment (FIG. 5A). A p-type GaAsP layer 13 a is then formed on the semiconductor body 11 as shown in FIG. 5B.

Figure 5C:
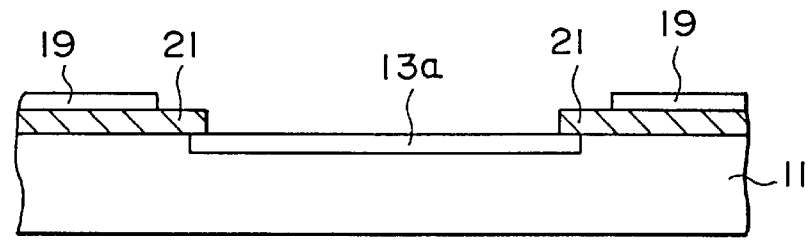
Figure 5D:
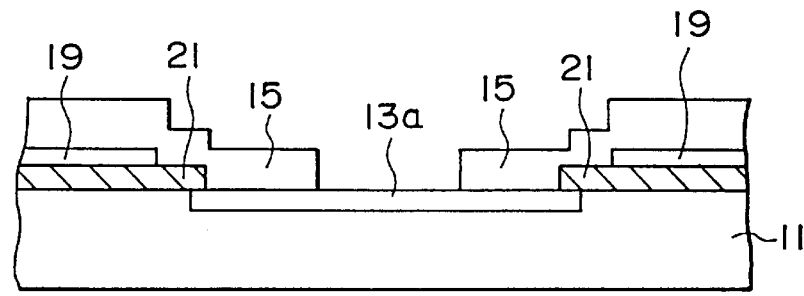

In this second embodiment, an insulation film 19 is then formed as shown in FIG. 5C in the same manner as processes of the first embodiment indicated in FIGS. 3F, 3G, in order to insulate the n-type semiconductor body 11 from a p-side electrode subsequently formed. Then, the p-side electrode 15 is formed as shown in FIG. 5D. The p-side electrode 15 is formed in the same manner as process shown in FIG. 3H. The p-side electrode 15 for each LED is formed so as to be isolated from the electrode for another LED. On the light emitting side of the LED arrays, the p-side electrode 15 exposes the surface of the p-type GaAsP layer 13a.

Figure 5E:
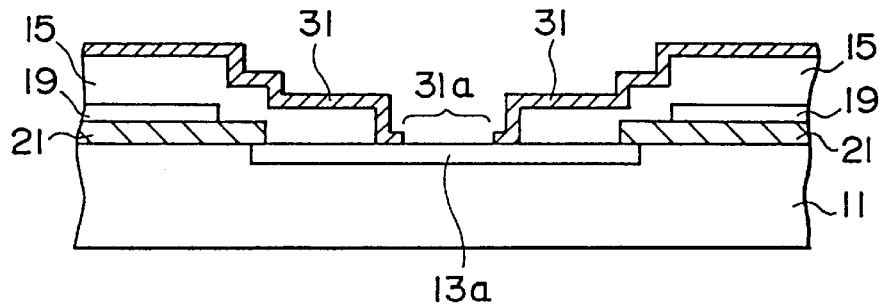
Figure 5F:
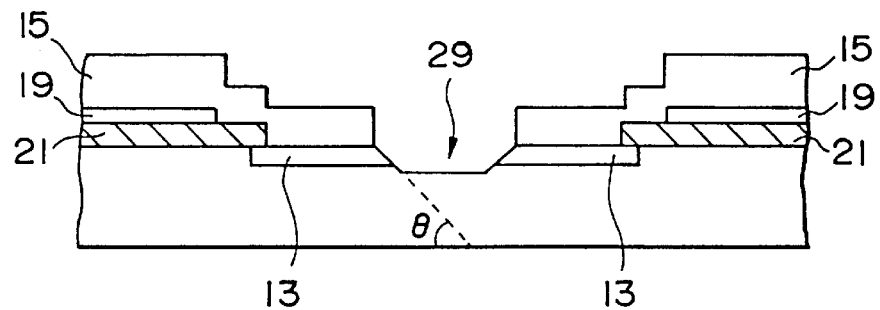

Recesses 29 are then to be formed on the wafer. To form the recesses 29, an etching mask 31 is formed on the entire surface of the wafer on which the p-side electrode 15 has been formed and is opened with windows 31a exposing the surface of the p-type GaAsP layer 13a at which the recesses 29 will be formed, as shown in FIG. 5E. The wafer on which the etching mask 31 has been formed is dipped into an etchant related to, such as, sulfuric acid, phosphoric acid, or citric acid, in the substantially same manner as the first embodiment. By this etching, the recesses 29 with angle θ of around 50 degrees between the side wall thereof and the major surface of the body are formed as shown in FIG. 5F.

Figure 5G:
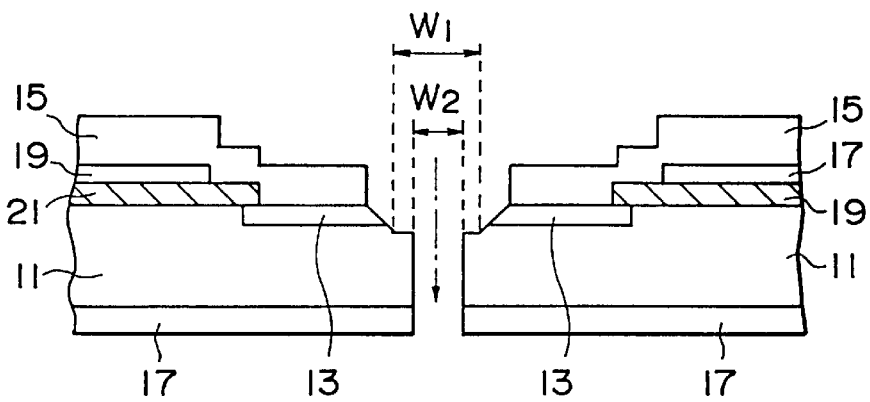

After the recesses 29 are formed, an n-side electrode 17 is formed, and then, the wafer is as shown in FIG. 5G subject to dicing to obtain a plurality of end facet light emitting type LED arrays 10.

Advantages of the second embodiment are as the follows. First, in the first embodiment, since the recesses 29 are formed prior to the formation of the p-side electrode 15, each p-side electrode 15 should be formed in a proper alignment to each recess 29. Accordingly, a precisely positioning process of the mask in the alignment to the recess 29 is required to form the p-side electrode 15. In contrast, an even less precisely positioning process can be satisfactorily used in the second embodiment, because the electrode 15 and the recess 29 are precisely aligned by simply forming the recesses 29 at positions between the p-side electrodes of the LED arrays next to each other, or at positions to be diced on the light emitting end facet side of the LED arrays. Therefore, the second embodiment can readily align the electrode 15 and the recess 29, thereby improving its yield. Second, in the first embodiment, the p-side electrodes 15 are formed on the semiconductor body 11 on which the recesses 29 have already formed. That is, the p-side electrodes 15 are formed on the semiconductor body 15 having the uneven surface due to the recesses 29. Therefore, the second embodiment takes advantage to this extent because, generally, such interconnection layers are much easily formed onto flat surfaces rather than onto uneven surfaces.

Third Embodiment

Although in the second embodiment the n-side electrode 17 is formed after the p-side electrode 15 and the recess 29 both are formed, the n-side electrode 17 is frequently formed after the back surface of the semiconductor body 11 is polished or ground when the n-side electrode 17 is to be formed. In such a case, it is preferable to form predetermined recesses 29 after the formation of the n-side electrode, as described in the third embodiment. Now, referring to FIGS. 6A To 6C, there describes the third embodiment according to the invention.

Figure 6A:
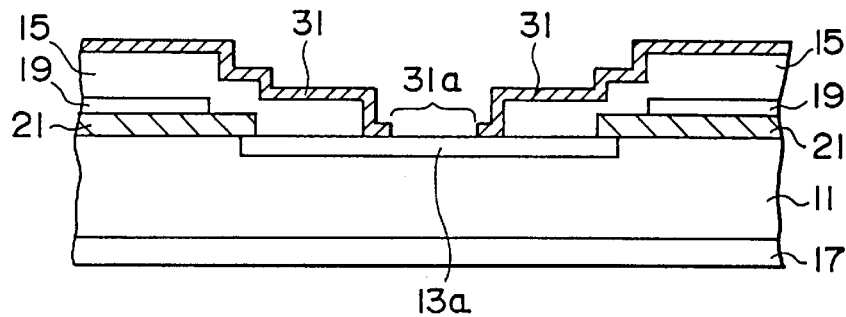
FIGS. 6A through 6C show cross sectional views of a process sequence for a manufacturing method for a light emitting diode array according to the third preferred embodiment of the second aspect of the invention.

First, the semiconductor wafer is subject to the processes up to the formation of the p-side electrode 15 in the same manner as the second embodiment as shown in FIGS. 5A to 5D. Then, the back surface of the semiconductor body 11 is ground and optionally polished, and the n-side electrode 17 is formed on the ground back surface in the same manner as above. An etching mask 31 is then formed as shown in FIG. 6A on the wafer so that the mask 31 is opened at windows 31a at which recesses are to be formed.

Figure 6B:
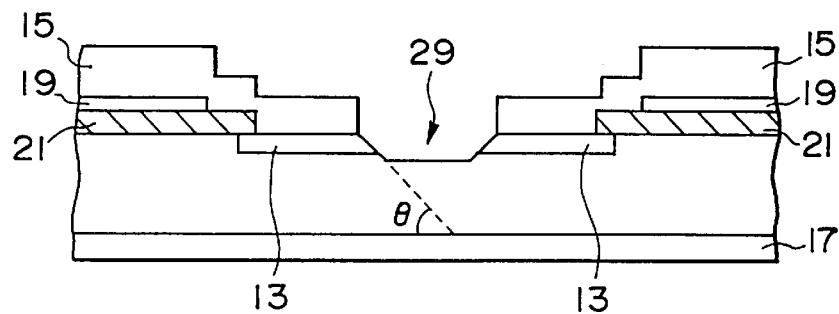
Figure 6C:
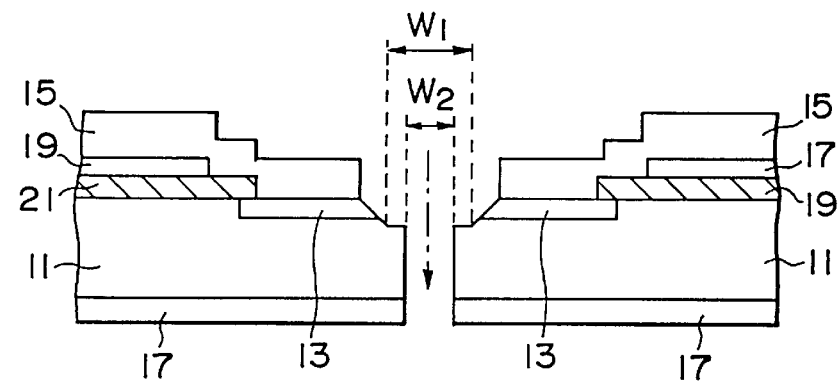

The wafer on which the etching mask 31 has been formed is dipped into an etchant related to, such as, sulfuric acid, phosphoric acid, or citric acid, in the substantially same manner as the first embodiment. By this etching, the recess 29 with angle θ of around 50 degrees between the side wall thereof and the major surface of the body is formed where the back surface of the semiconductor body 11 is with the n-side electrode 17 as shown in FIG. 6B. Subsequently, as shown in FIG. 6C, the wafer is diced to obtain a plurality of end facet light emitting type LED arrays 10.

The third embodiment has advantageous features as follows. When the back surface of the semiconductor body 11 is to be ground for formation of the n-side electrode, the surface opposite to the back surface on which the n-side electrode is to be formed, or the surface on which the p-side electrode 15 is formed, is generally attached to a grinding plate by wax or the like. After attached by the wax or the like, the semiconductor wafer is ground at the back surface of the semiconductor body; the wafer is then detached from the grinding plate; and finally, the wax is removed from the wafer. If recesses were formed before the wafer is ground, the wax incidentally enters the recesses when the wafer is attached to the grinding plate, and therefore, the wax tends to remain in the recesses even after the removing process of the wax. If so, the wafer may raise problems that light emitting amounts become dispersed among devices due to influence of the wax. In contrast, the third embodiment may not raise such problems because the recesses are formed after the grinding process. Furthermore, the semiconductor body is at a risk that it may be broken at the recesses depending on force exerted to the recesses when the semiconductor body on which the recesses have been formed is ground. The third embodiment, however, may not raise such a problem because the recesses are formed after the grinding process.

Fourth Embodiment

The end facet light emitting type LED array or other light emitting device is preferably formed with a protection film (end facet protection film) at the light emitting end facet for protecting the end facet. This is because the protection film can prevent the light emitting end facet from receiving damages when an LED print head is assembled or when the device is used later. The protection film may also improve emitting efficiency of light to the air since the pnjunction does not expose directly to the air by being equipped with the end facet protection film. The fourth embodiment describes an example in which after recesses are formed the etching mask used for the formation of the recesses is used, as it is, in order for formation of the end facet protection film. Referring to FIGS. 7A to 7E, the fourth embodiment is described.

Figure 7A:
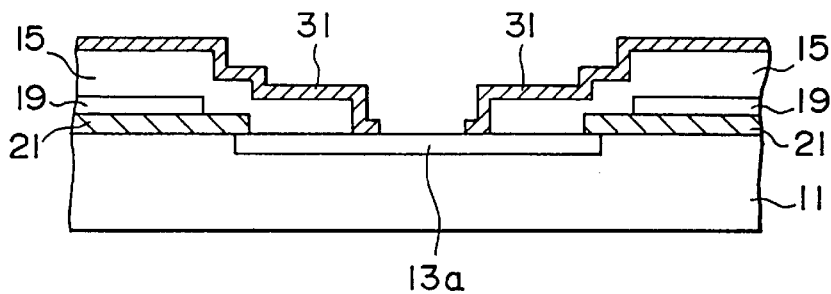
FIGS. 7A through 7E show cross sectional views of a process sequence for a manufacturing method for a light emitting diode array according to the fourth preferred embodiment of the second aspect of the invention.
Figure 7B:
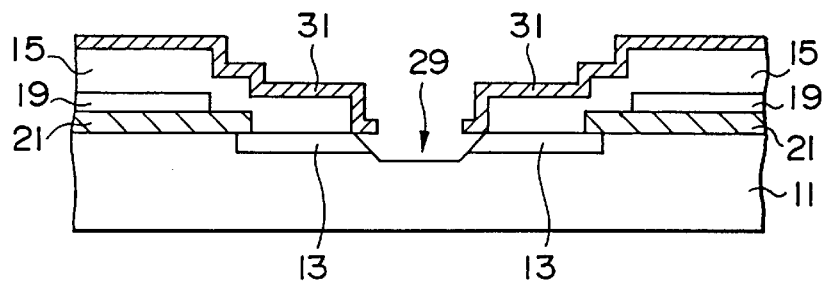

First, as shown in FIG. 7A, an anti-diffusion film 21, a p-type GaAsP layer 13a, an insulation film 19, a p-side electrode 15, and an etching mask 31, as a resist pattern, for forming recesses are respectively formed in the same manner as described above in the second embodiment with FIG. 5A to 5G. The wafer is then subject to etching in the manner as well as in the first embodiment to form recesses 29 on the wafer as shown in FIG. 7B.

Although in the second embodiment the etching mask 31 is removed after the etching process, a thin film 33 for formation of the end facet protection film is, in the fourth embodiment, formed on the entire surface of the wafer where the etching mask 31 still remains. The end facet protection film can be formed by various proper methods. In this fourth embodiment, the following method is used as one example.

As a method, the thin film 33 can be obtained by coating on the entire surface of the wafer at least one kind of materials selected from silicone material for thin film formation capable of being spin-coated, silicon-oxidic and titanium-oxidic material capable of being spin-coated, silicon-oxidic material modified with organic groups and capable of being spin-coated, acrylic polymer material capable of being spin-coated, and fluoric polymer material capable of being spin-coated.

As a silicon-oxidic material capable of being coated, the material indicated by following Formula (1) which shows the structure of the material after the film is completed is exemplified. In Formula (1), "Film Surface" represents the surface structure of the thin film 33; "In-Film" represents the structure in the thin film 33. As specific examples for a silicon-oxidic material capable of being coated, such as: Ceramate (Trade Name), No. AL-AL5K7 or LNT—LNT52, made by Shokubai Kasei K. K.; HTL or NHC(A) (Trade Name) made by Nissan Kagaku K. K.; and OCD-2 (Trade Name), made by Tokyo Ohka Kogyo K. K., can be exemplified. These exemplified does not have photosensitive property. However, silicon-oxidic material capable of being spin-coated and photosensitive can be used. For example, a photosensitive resin compound (i.e., as proposed in Japanese Patent Application No. 6-13,309, filed by this assignee) composed of polysiloxane derivative including one or more alkoxyl groups and oxygen generator for generating oxygen upon exposure to light, can be exemplified.

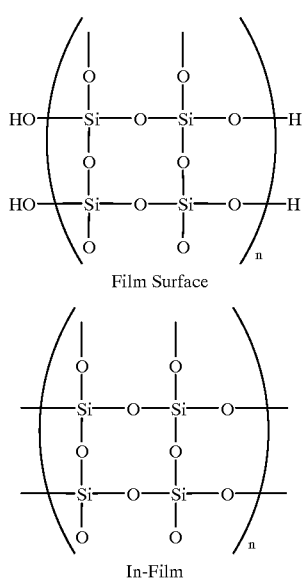

Formula (1)

As a silicon-oxidic and titanium-oxidic material capable of being spin-coated, for example, the following material as indicated by Formula (2) is exemplified. In specific, NHC-AT (Trade Name) made by Shokubai Kasei K. K., MOFINK (Trade Name) made by Tokyo Ohka Kogyo K. K., and the like can be exemplified.

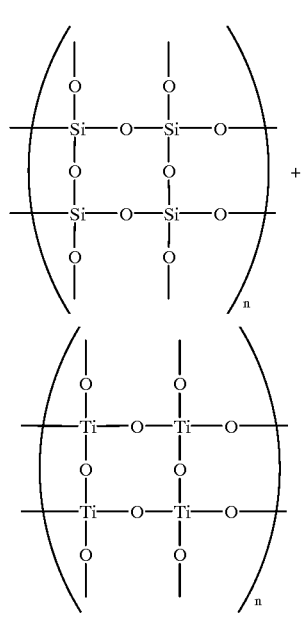

Formula (2)

As a silicon-oxidic material modified with organic groups and capable of being spin-coated, for example, the following material as indicated by Formula (3) is exemplified. The letter R in Formula (3) can represent alkyl groups (i.e., methyl groups, ethyl groups). Specifically, NHC-AT (Trade Name) made by Shokubai Kasei K. K., MOFINK (Trade Name) made by Tokyo Ohka Kogyo K. K., and the like can be exemplified.

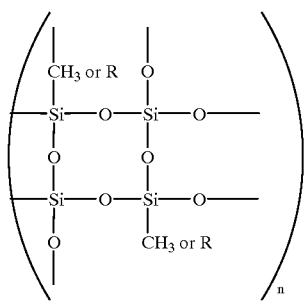

Formula (3)

As an acrylic polymer material capable of being spin-coated, for example, the following material as indicated by Formula (4) is exemplified. The letter R in Formula (4) can represent alkyl groups (i.e., methyl groups, ethyl groups). Specifically, HRC (Trade Name) made by Nihon Gosei Gomu K. K. or the like can be exemplified.

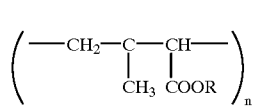

Formula (4)

As a fluoric polymer material capable of being spin-coated, for example, the following material as indicated by Formula (5) is exemplified. As a specific example, V259-PA (Trade Name) made by Shinnitetsu Kagaku K. K. can be exemplified.

Formula (5)

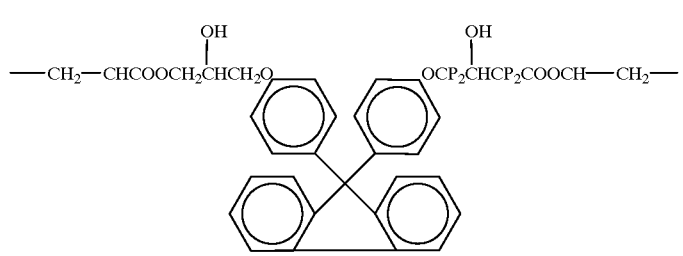

Figure 7C:
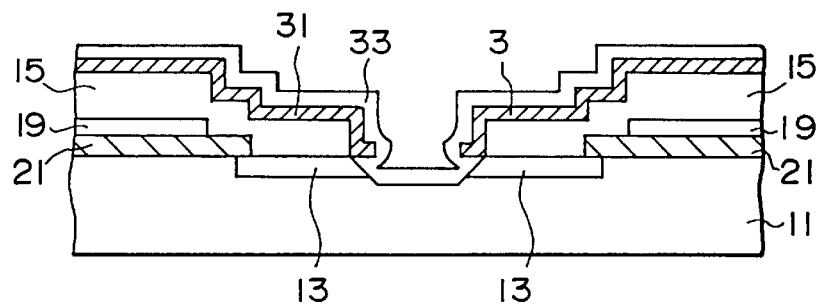
Figure 7D:
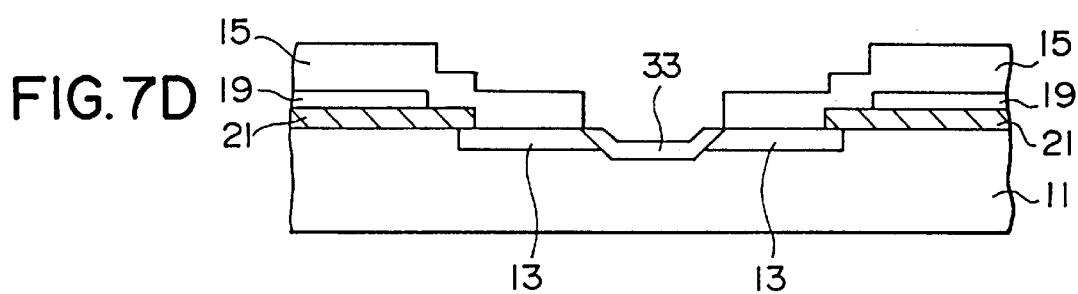

When the silicon-oxidic material capable of being spin-coated is used, the material is coated by a spin coater over the entire surface of the wafer in a condition shown in FIG. 7B to form the thin film 33 as shown in FIG. 7C. The coated material is then heat-treated at a temperature at which the etching mask 31 does not completely become rigid, or for example, at a temperature less than 100° C. Subsequently, the etching mask 31 is removed by a remover for the etching mask. The thin film's portions formed on the etching mask 31 are also removed at the same time when the etching mask 31 is removed. Accordingly, the thin film 33 remains only at the inner walls and bottoms of the recesses 29 as shown in FIG. 7D. When the remaining thin film is subject to a heat-treatment of a predetermined temperature, i.e., 150 through 300° C., an inorganic film of $SiO_2$ system is obtained. Upon application of this method, for example, an end facet protection film 33a of $10^9$ to $10^{12} \Omega \cdot cm$ in resistance rate, transparent in passing of emitted light, and of 0.5 to 2.0 micrometers in thickness, is obtainable.

Figure 7E:
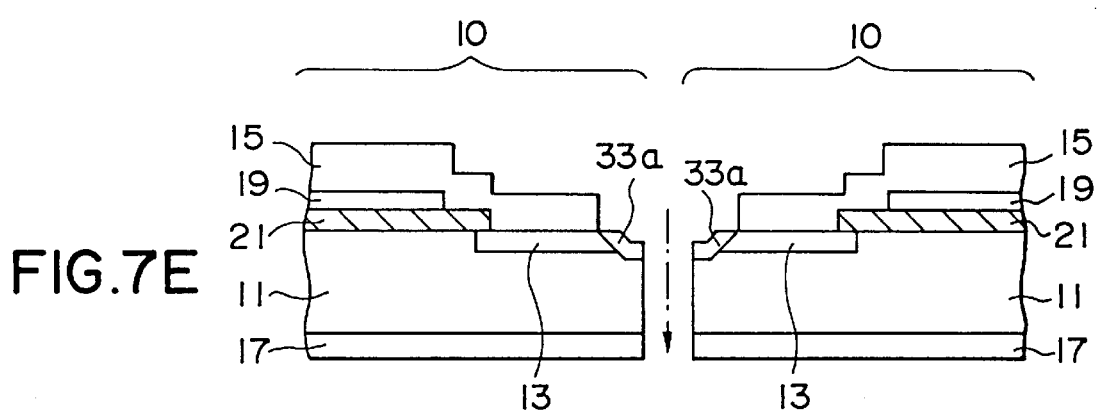

An n-side electrode 17 is formed in substantially the same manner as the first embodiment, and as shown in FIG. 7E, the wafer is diced in substantially the same manner as, for example, the first embodiment. Diced portions of the wafer constitute LED arrays 10 that their light emitting end facets are slanted and formed with the end facet protection films 33a.

The forming method of the thin film 33 for forming the end facet protection film is not restricted to the spin-coating method. For example, it can be done using an offset printing method. That is, an offset printing method allows the above-exemplified silicon-oxidic and titanium-oxidic material to form a thin film. The thin film 33 for forming the end facet protection film can be formed by forming an SiN film or an $SiO_2$ film through methods such as low temperature vaporization or low temperature plasma CVD. Low temperature here means temperature that does not render resist patterns as etching masks 31 completely rigid. The wafer on which the recesses 29 have been formed and etching masks 31 are remaining can be subject to a predetermined treatment (i.e., flowing current) where the wafer is dipped into a fluid allowing anode formation. Such anode formation treatment forms anode formation films at the inner walls and bottoms of the recesses 29. The anode formation film can be used as the thin film 33 for forming the end facet protection film. A fluid mixed of hydrogen peroxide and water is usable, not exclusively, as the fluid allowing anode formation.

According to the fourth embodiment, the end facet protection film is readily formed by using the etching masks for forming the recesses as they are.

Fifth Embodiment

Although in the first to fourth embodiments the light emitting layer (p-type GaAsP layer 13) is formed before the predetermined recess 29 is formed, the light emitting layer (p-type GaAsP layer 13) can be formed after a predetermined recess is formed, because this change renders the processes more flexible. The fifth embodiment describes such an example with reference to FIGS. 8A to 8E.

Figure 8A:
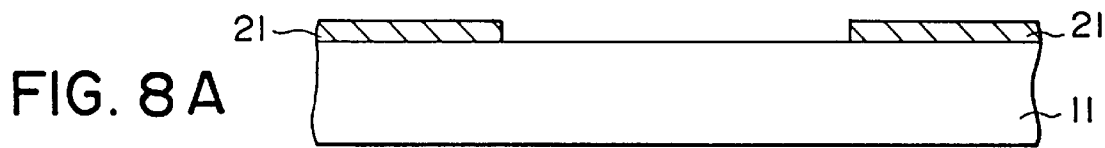
FIGS. 8A through 8E show cross sectional views of a process sequence for a manufacturing method for a light emitting diode array according to the fifth preferred embodiment of the second aspect of the invention.

First, a first conductivity type, in this case, an n-type, semiconductor body is used. The n-type semiconductor body 11 is, as well as in the embodiments above, constituted of an n-type GaAs substrate and an n-type GaAsP layer epitaxtially grown on the n-type GaAs substrate. Then, an anti-diffusion film 21 is formed on the n-type semiconductor body 11, for example, in the same manner as the first embodiment (FIG. 8A).

Figure 8B:
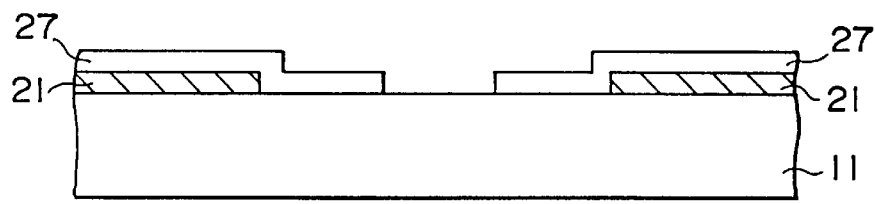
Figure 8C:
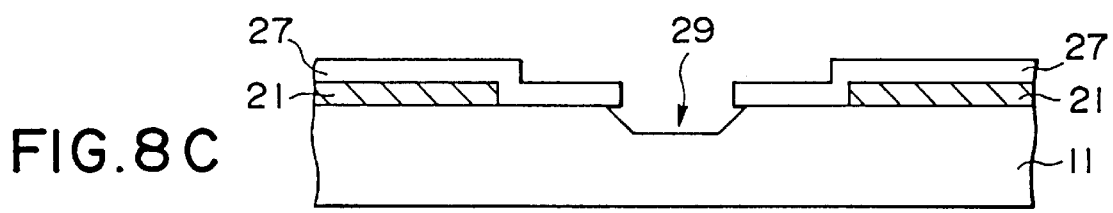

In this fifth embodiment, before a p-type GaAsP layer is formed, predetermined recesses 29 are formed on the n-type semiconductor body 11. The recesses 29 are formed by the methods as described in the first embodiment with reference to FIGS. 3C, 3D in which a certain etching mask 27 is formed on the wafer and it is subsequently dipped into an etchant related to, such as, sulfuric acid, phosphoric acid, or citric acid (FIGS. 8B, 8C).

Figure 8D:
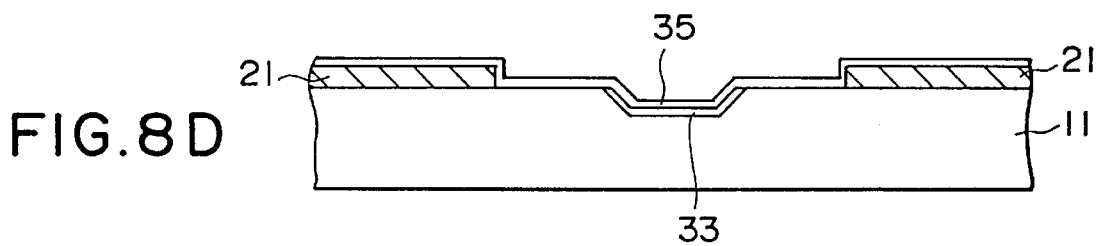

As shown in FIG. 8D, a thin film 33 for forming end facet protection film is formed in the recess 29 thus formed. The thin film 33 can be formed by the method described in the fourth embodiment in which the thin film 33 is selectively made to remain at the inner walls and bottoms of the recesses 29 using the etching mask 27 for forming the recesses 29.

A diffusion control film 35 is then formed on the wafer as shown in FIG. 8D. The diffusion control film 35 can be constituted of a film selected from, for example, alumina film, nitride film, silicon oxide film, and PSG film. The diffusion control film 35 can be formed with thickness of 10 to 20 nanometers.

Figure 8E:
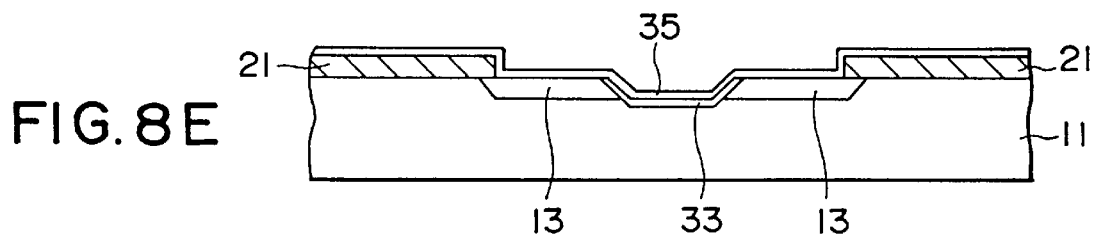

Multiple p-GaAsP layers 13 are formed at regions of the n-type semiconductor body 11 at which the anti-diffusion film 21 and the thin film 33 for forming the end facet protection film do not cover, by vapor diffusion of p-type impurity such as zinc (Zn) through the diffusion control film 35, as shown in FIG. 8E. The p-type GaAsP layers 13 are formed, as a matter of course, in the number corresponding to the number of LEDs for the LED arrays and formed with intervals therebetween. The diffusion control film 35 is then removed by proper means.

Then, the p-side electrode and the n-side electrode are formed and the wafer is diced, in the same manner as the first embodiment.

Sixth Embodiment

Figure 9:
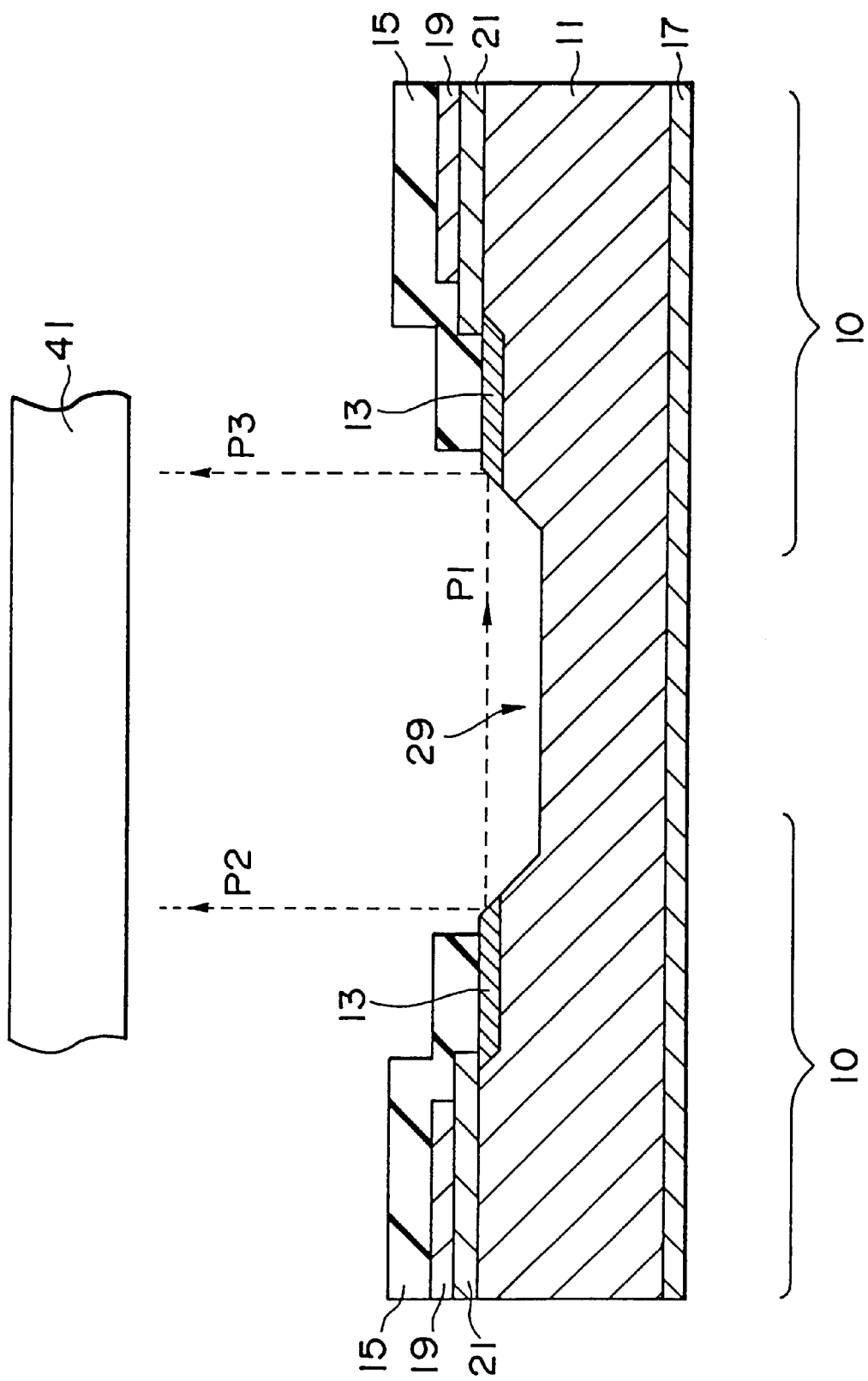
FIG. 9 shows cross a sectional view of a light emitting diode array when the array is measured according to the sixth preferred embodiment of the second aspect of the invention.

Referring to FIG. 9, a sixth embodiment for measuring light emitting characteristics with respect to multiple LED arrays that formed on a semiconductor wafer where the semiconductor wafer remains undivided, is described as follows.

First, a photosensor 41 is placed above the recess 29 of the semiconductor wafer on which multiple LED arrays 10 have been formed. Next, the n-side electrode 17 is electrically set at a ground level, and a positive potential is given to a p-side electrode 15 of one of the LEDs of one LED array 10 so as to flow a current through the p-type GaAsP layer 13 of the LED. The current is constant and, for example, of 5 mA. By flowing the current, light is made to emit from the interface, or pn-junction, between the p-type GaAsP layer 13 and the n-type GaAsP layer, not shown, in the semiconductor body 11. The light thus generated is emitted from the side wall of the recess 29, or the light emitting end facet 29a composed of the inclined face, to the outside of the LED array. Regarding light emitted, since the light emitting end facet is thus inclined, light P2 emitting in the perpendicular direction to the major surface of the semiconductor body 11 is also generated as shown in FIG. 7 in addition to light P1 emitting in a direction in parallel with the major surface of the semiconductor body 11. The emitted light P1 is reflected in the perpendicular direction of the major surface, at an inclined face 29b opposite to the light emitting end facet 29 a with respect to the recess 29 and constitutes light P3. Those light P2 and light P3 enter the photosensor 41 that have been disposed above the semiconductor wafer. Current occurs at the photosensor 41 in accordance with intensity of light received at the photosensor 41, thereby enabling the light emitting characteristics of the one LED of the LED array 10 to be measured. When the respective LEDs of one LED array 10 are subsequently operated one by one in the manner above, a judgment as to whether all the LEDs in one LED array 10 are proper is made, and further, a judgment as to whether the LED array 10 itself is proper is made. The same operation is also conducted to other LED arrays formed on the semiconductor wafer. Therefore, the light emitting characteristics of the respective LED arrays 10 is measured where the semiconductor wafer remains undivided.

Examples for Assembly of the LED array
First Assembly Example

Figure 10:
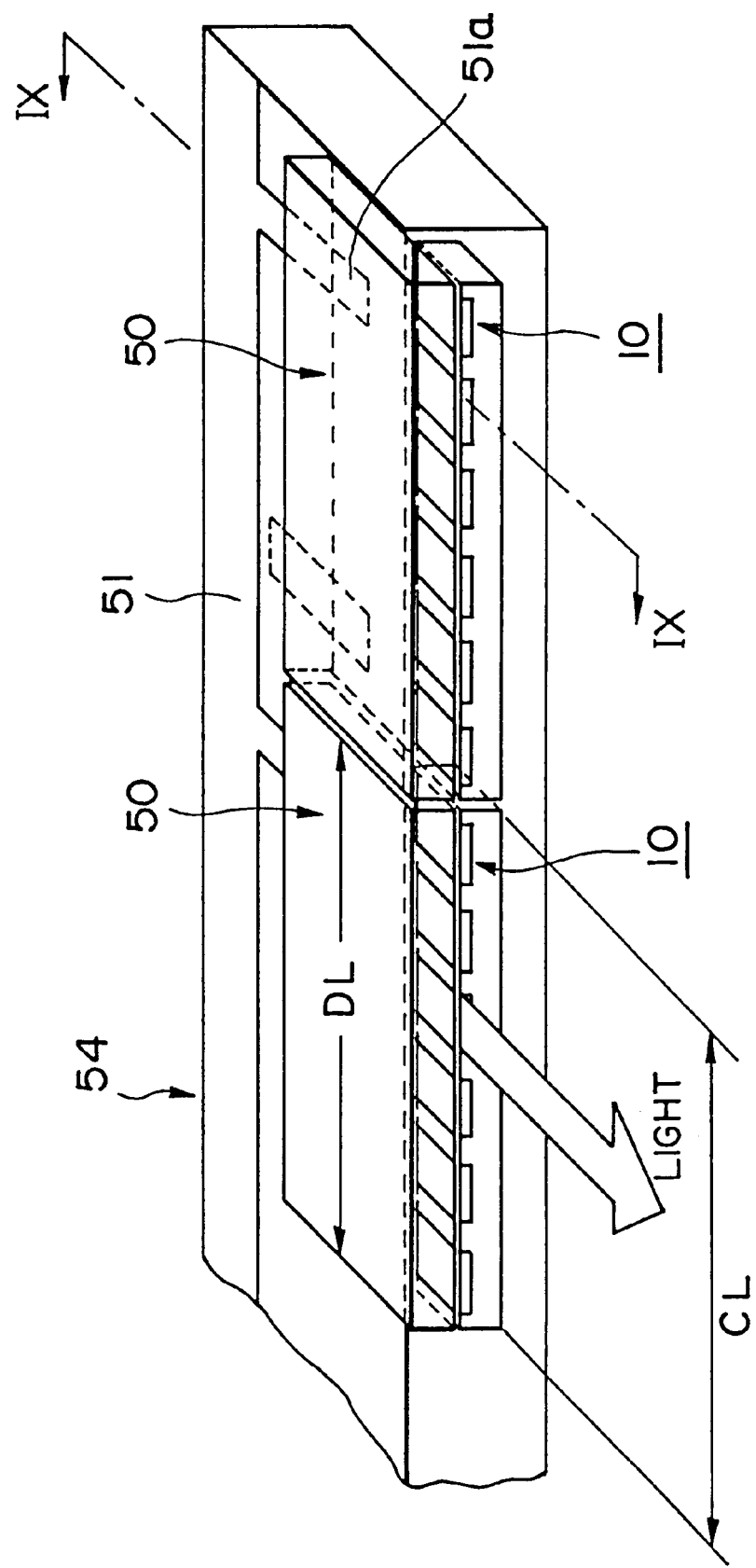
FIG. 10 is a perspective view of the light emitting diode array shown in FIG. 3 when the array is mounted on a printed circuit board.

Referring to FIGS. 10, 11, an LED array unit in which the LED arrays according to the embodiments above is described. FIG. 10 is a perspective view of an essential portion of the LED array unit 54 built with multiple LED arrays according to the embodiments above, driver ICs 50, and the like. FIG. 11 is a cross section, taken along IX—IX line in FIG. 10, of the LED array unit shown in FIG. 10.

The end facet light emitting type LED array unit 54 is constituted of a printed circuit board 51, driver ICs 50 mounted on the board, and LED arrays 10 connected on its side facing the printed circuit board 51. Each LED array 10 and the driver IC 50 are connected with each other in use of a so called bump technique. The length DL of the driver IC 50 is shorter than the length CL of the LED array 10. The light from the LED array 10 is outputted from the almost middle position in the thickness direction of the LED array unit as shown in FIG. 11.

The end facet light emitting type LED array unit 54 is assembled as follows. First, the LED arrays 10 are disposed on the driver IC 50 so as to contact the p-side electrodes on the LED array 10 with the corresponding terminals of the driver IC 50, and the p-side electrodes and the terminals are electrically connected with each other through the bump technique. Such stacked bodies are prepared at least in the necessary number for constituting the LED array unit. The bump technique here means adhesive techniques by solder, thermosetting resin, ultraviolet light setting resin, anisotropic conductive resin, or whatever. The stacked bodies of the LED array 10 and the driver IC 50 are placed on the printed circuit board 51 so that the pn-junctions of respective stacked bodies come to be in a line with the same height. The driver ICs 50 of the stacked bodies are fixed to predetermined wiring portions on the printed circuit board 51 by the bump technique. As shown in FIG. 9, the n-side electrode of the LED array 10 is connected to a predetermined wiring portion using a conductive paste 51b.

The end facet light emitting type LED array unit 54 thus formed essentially has the following features. The p-side electrodes of the LED array 10 and the corresponding terminals of the driver IC 50 are electrically and directly connected with each other. Therefore, the end facet light emitting type LED array unit 54 can be made compact, in comparison with a unit in which the LED array and the driver IC are connected by a wire bonding method, because the wire bonding method requires bonding pads occupying wide areas and such pads are required to be placed away from the p-side electrodes, and because those are unnecessary for the unit in which the p-side electrodes and the corresponding terminals are connected directly.

The LED array 10 has the p-side electrodes on only one side of the array. The p-side electrodes are connected with the corresponding terminals of the driver IC 50 by the bump technique. If other electrodes such as the n-side electrodes exist in the same face on which the p-side electrodes are provided, defective connections may easily occur due to positional differences in height among the electrodes. In this assembly example, the driver IC 50 is connected to only one kind of electrodes (p-side electrodes) by the bump technique, so that defective connections may not occur.

The printed circuit board 51 essentially require no more than connections for the driver ICs, or specifically, connections for the signals for operation of driver ICs and connections for power supply, and does not require wiring or connection for each p-side electrode in the LED array. That is, this unit can eliminate fine wiring, though ordinary other units having respective connections for p-electrodes of the array require such fine wiring according to unit's resolution. Since no fine connection is required, the printed circuit board can be made inexpensive. Furthermore, the printed circuit board can be made of materials, such as glass epoxy resin, that generally not categorized for high density assembling.

Since the n-side electrode of the LED array 10 is not connected to the printed circuit board 51, no wiring corresponding to the n-side electrode is required for the driver IC 50. Accordingly, the driver IC 50 can be made inexpensive and compact.

FIG. 12 shows an example of an electrophotographic print head to which the end facet light emitting type LED array unit 54 applies. The print head 53 is constituted of the LED array units 54 as described above, a rod lens array 55, and a frame 56 for supporting the units 54 and the lens array 55. The LED array unit 54 and the rod lens array 55 are supported by the frame 56 so that the center of the rod lens array 55 comes to be located on an extension line of the pn-junction plan of the LED array unit 54. The numeral 57 represents a photosensitive drum in FIG. 12.

Second Assembly Example

Figure 13:
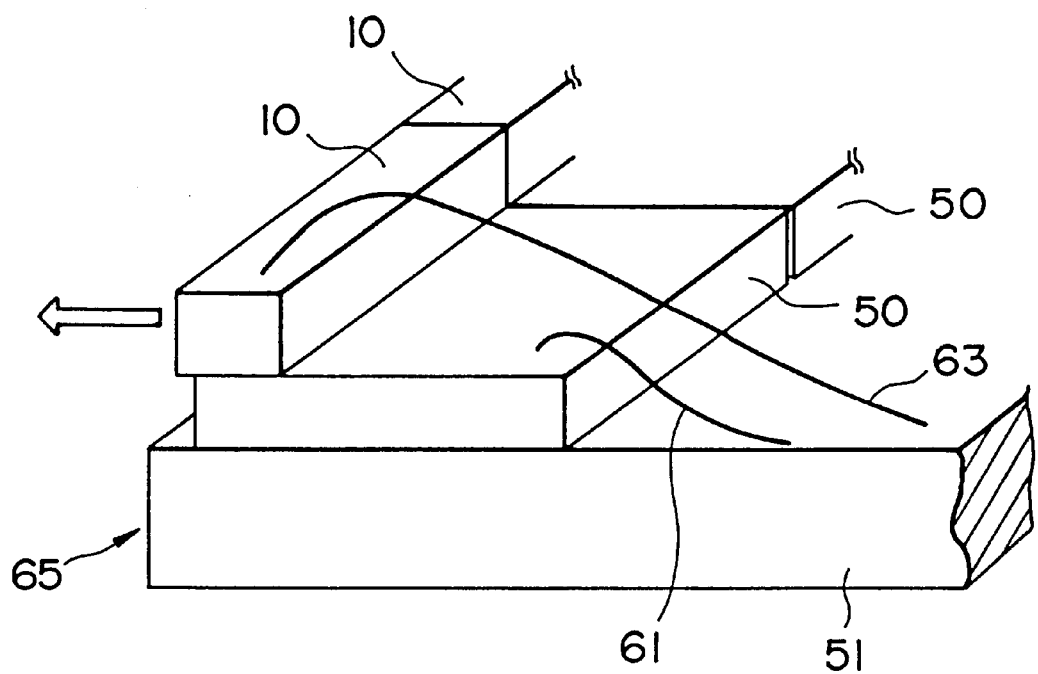
FIG. 13 is a perspective illustration showing the light emitting diode array shown in FIG. 3 formed on a printed circuit board.

FIG. 13 is a perspective view showing an essential portion of another LED array unit 65 constituted by assembling multiple LED arrays 10 as described above, driver ICs 50, and whatever.

The end facet light emitting type LED array unit 65 is assembled by sequentially stacking the driver ICs 50 and the LED arrays 10 on the printed circuit board 51. The driver IC 50 and the LED array 10 are connected by the bump technique as described above. The driver IC 50 is secured to the printed circuit board 51 by a face having no terminal in opposition to the face on which the LED array 10 is connected, so that the driver IC 50 and the printed circuit board 51 are fixed to each other merely by adhesive. Connection portions, i.e., connections for signals for operation of the driver and connections for power supply, of the printed circuit board 51 and corresponding terminals of the driver IC 50 are connected by wires 61. The n-side electrode of the LED array 10 and the corresponding portion of the printed circuit board 51 are connected by a wire 63. The LED array unit 65 has the same features as the LED array unit 54 described above.

Third Assembly Example

Figure 14:
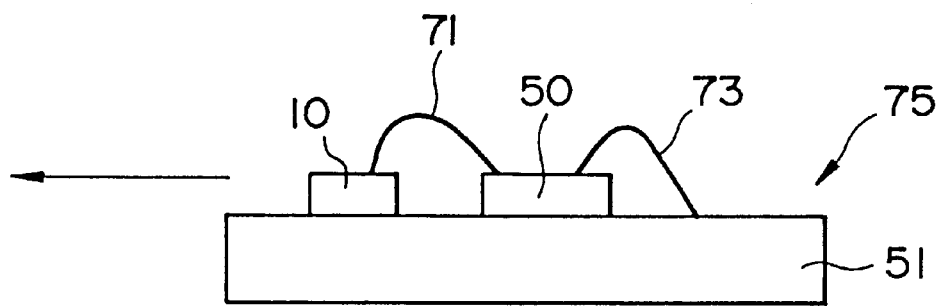
FIG. 14 is a side view of the light emitting diode array shown in FIG. 3 formed on another printed circuit board.

FIG. 14 is a side view showing an essential portion of yet another LED array unit 75 constituted by assembling multiple LED arrays 10 as described above, driver ICs 50, and whatever.

The end facet light emitting type LED array unit 75 is assembled by flatly arranging the driver ICs 50 and the LED arrays 10 on the printed circuit board 51. The LED arrays 10 are connected with the printed circuit board on their n-side electrodes' side. The n-side electrode can be connected to the corresponding terminal of the printed circuit 51 using conductive paste such as silver paste. The driver IC 50 is fixed to the printed circuit board 51 by making its face having no terminal adhere to the board. Each p-side electrode of the LED array 10 is connected to the corresponding terminal of the driver IC 50 by a wire group 71. Connection portions, i.e., connections for signals for operation of the driver and connections for power supply, of the printed circuit board 51 and corresponding terminals of the driver IC 50 are connected by wires 73.

The LED array unit 75 has the same features as the LED array unit 54 described above. Since no n-side electrode is provided on the face on which the p-side electrodes are formed, the LED array 10 can be formed with a smaller width than an LED array having p-side and n-side electrodes on the same face. Moreover, the LED array unit 75 can readily avoid defective connections because the wiring for wire bonding does not become dense.

As apparent from the foregoing description, the end facet light emitting type LED is constructed such that the light emitting facet is placed on a slant so that the light deriving area can be broaden in comparison with the conventional type in which the light emitting end facet is perpendicular to the surface of the substrate.

According to the invention, recesses having a certain depth and slant side walls are formed at a pn-junction face of a semiconductor wafer, and the wafer is then diced at positions away from the pn junctions below the recesses. Consequently, the light emitting layer can be separated vertically and horizontally from the portions to be cut, so that if cracks occur due to impacts when the wafer is diced the cracks does not affect the light emitting layer. Since upper side electrodes are not subject to dicing, the manufacturing method does not raise problems that raised when such upper side electrodes are diced.

With the measuring method according to the invention, a part of light from the light emitting device built on the semiconductor wafer is reflected at inclined side walls of the recesses, in an upper direction of the semiconductor wafer, and is monitored. Therefore, the respective light emitting characteristics of the end facet light emitting type light emitting devices built on the semiconductor wafer can be measured as the semiconductor wafer remains undivided.

It is understood that although the present invention has been described in detail with respect to preferred embodiments thereof, various other embodiments and variations are possible to those skilled in the art which fall within the scope and spirit of the invention, and such other embodiments and variations are intended to be covered by the following claims.

What is claimed is:

1. A light emitting diode array comprising a plurality of end facet light emitting type light emitting diodes for a light source of an electrophotographic printer, each of said diodes comprising:

an n-type semiconductor substrate which is common to each of said diodes, said n-type semiconductor substrate comprising an n-type GaAs substrate having an n-type GaAsP epitaxial layer formed therein;

a p-type GaAsP diffusion layer formed in said n-type semiconductor substrate:

a light emitting end facet which is oriented at a slant relative to a major surface of said n-type semiconductor substrate.

2. A light emitting diode array as set forth in claim 1, further comprising an end facet protection film on the light emitting end facet for protecting the same.

3. An end facet light emitting type light emitting diode array as claimed in claim 1, wherein said light emitting end facet constitutes the primary light emitting surface of said light emitting diode.

4. An end facet light emitting type light emitting diode array as claimed in claim 2, wherein said light emitting end facet constitutes the primary light emitting surface of said light emitting diode.

5. A light emitting diode array comprising a plurality of end facet light emitting type light emitting diodes for a light source of an electrophotographic printer, each of said diodes comprising:

an n-type semiconductor substrate which is common to all of said diodes and having a major surface extending substantially in a first plane, said n-type semiconductor substrate comprising an n-type GaAs substrate having an n-type GaAsP epitaxial layer formed thereon:

a p-type GaAsP diffusion layer formed in said n-type semiconductor substrate; and a light emitting end facet, having a surface extending substantially in said p-type GaAsP diffusion layer, which is slanted at an angle relative to said first plane, said light emitting end facet constituting the primary light emitting surface of said light emitting diode.

6. A light emitting diode array as claimed in claim 5, wherein said angle is approximately 40 to 50 degrees.

7. A light emitting diode array as claimed in claim 1, wherein said angle is approximately 40 to 50 degrees.

8. A light emitting diode array as claimed in claim 5, further comprising a protective film covering said light emitting end facet.

9. A light emitting diode array as claimed in claim 7, further comprising a protective film covering said light emitting end facet.

10. A light emitting diode array for a light source of an electrophotographic printer, comprising:

an n-type semiconductor substrate having a major surface extending substantially in a first plane, said n-type semiconductor substrate comprising an n-type GaAs substrate having an n-type GaAsP epitaxial layer formed thereon;

a first end facet light emitting type light emitting diode comprising a first p-type GaAsP diffusion layer formed in said n-type semiconductor substrate, and a first light emitting end facet, having a surface extending substantially in said first p-type GaAsP diffusion layer, which is slanted at an angle relative to said first plane; and a second end facet light emitting type light emitting diode comprising a second p-type GaAsP diffusion layer formed in said n-type semiconductor substrate, and a second light emitting end facet, having a surface extending substantially in said first p-type GaAsP diffusion layer, which is slanted at an angle relative to said first plane;

wherein said first and second light emitting end facets are spaced apart and face each other such that light emitting from each one of said first and second light emitting end facets is reflected off the other of said first and second light emitting end facets.

* * * * *